(12) United States Patent
Tanaka et al.

(10) Patent No.: US 7,842,229 B2
(45) Date of Patent: Nov. 30, 2010

(54) SUBSTRATE PROCESSING APPARATUS AND SUBSTRATE ROTATING DEVICE (75) Inventors: Sumi Tanaka, Nirasaki (JP); Kouki Suzuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 107 days.

(21) Appl. No.: 11/666,349

(22) PCT Filed: Oct. 27, 2005

(86) PCT No.: PCT/JP2005/019795

§ 371 (c)(1),
(2), (4) Date: Oct. 25, 2007

(87) PCT Pub. No.: WO2006/046649

PCT Pub. Date: May 4, 2006

(65) Prior Publication Data

US 2008/0042328 A1 Feb. 21, 2008

(30) Foreign Application Priority Data

Oct. 28, 2004 (JP) ............................. 2004-313919

(51) Int. Cl.
*C21D 9/00* (2006.01)
*C21B 3/00* (2006.01)
(52) U.S. Cl. ...................... 266/249; 266/276
(58) Field of Classification Search ............ 266/249, 266/276; *C21D 3/00, 9/00*
See application file for complete search history.

(56) References Cited

U.S. PATENT DOCUMENTS 5,145,812 A * 9/1992 Arai et al. .................. 501/96.2

2004/0170347 A1 * 9/2004 Ikeda et al. ................... 384/492

FOREIGN PATENT DOCUMENTS

| JP | 59-089227 | 5/1984 |
|---|---|---|
| JP | 61-281087 | 12/1986 |

(Continued)

OTHER PUBLICATIONS

Notification of Transmittal of Copies of Translation of the International Preliminary Report on Patentability (Form PCT/IB/338), in connection with PCT/JP2005/019795, dated Jan. 2004.

(Continued)

*Primary Examiner*—Jessica L Ward
*Assistant Examiner*—Alexander Polyansky
(74) *Attorney, Agent, or Firm*—Smith, Gambrell & Russell, LLP (57) ABSTRACT Disclosed is a substrate rotating device improved such that an amount of particle generation is remarkably reduced, and a substrate processing apparatus provided with the substrate rotating device. The substrate rotating device includes a driven rotary member, e.g., a driven ring, connected directly or indirectly to a substrate support member for supporting a substrate; and a driving rotary member, e.g., a drive rotor, that rotates in abutment against the driven rotary member to drive the driven rotary member for rotation. The driven rotary member and the driving rotary member are formed of ceramic materials, whose values of fracture toughness defined by JIS R1607 are different from each other, and/or whose values of three-point bending strength defined by JIS R1601 are different from each other.

12 Claims, 4 Drawing Sheets

FOREIGN PATENT DOCUMENTS

| | | | |
|---|---|---|---|
| JP | 62-91481 | | 4/1987 |
| JP | 63-047554 | | 2/1988 |
| JP | 11-097367 | * | 4/1999 |
| JP | 2001-057344 | * | 2/2001 |
| JP | 2001-102433 | | 4/2001 |

OTHER PUBLICATIONS

Translation of International Preliminary Report on Patentability (Form PCT/IPEA/409), in connection with PCT/JP2004/019795, dated Jan. 2004.

* cited by examiner

SUBSTRATE PROCESSING APPARATUS AND SUBSTRATE ROTATING DEVICE

TECHNICAL FIELD

The present invention relates to a substrate processing apparatus for processing (e.g., heat-treating) a substrate such as a semiconductor wafer, as well as a substrate rotating device for rotating the substrate in the substrate processing apparatus.

BACKGROUND ART

As one example of a substrate processing apparatus typified by a semiconductor manufacturing device, there has been known a device that heats a substrate such as a semiconductor wafer using a heating means such as a heat radiation lamp to perform a heat treatment such as annealing. JP2001-57344A discloses, as an example of such a device, a single substrate heat treatment apparatus that processes a substrate while rotating the substrate. The rotation of the substrate is performed for heating the substrate uniformly.

A single substrate heat treatment apparatus employs a rotating mechanism including a driven rotary member connected directly or indirectly to a substrate support member for supporting a substrate thereon, and a driving rotary member that rotates in contact with the driven rotary member to cause the driven rotary member and the substrate support member connected thereto to rotate together. For the material of the driven and driving rotary members which constitute such a rotating mechanism, a ceramic material such as silicon carbide (SiC) is used, so that the material can withstand a high temperature in the heat treatment apparatus that sometimes exceeds 1000° C.

In a semiconductor manufacturing device, including the heat treatment apparatus, it is an important subject to diminish the particle contamination of a semiconductor wafer which results in defective semiconductor devices. Particles produced from device parts disposed near a semiconductor wafer and from intra-chamber deposits are considered to be a main cause of the particle contamination. There have been taken various countermeasures to diminish particles. However, in the heat treatment apparatus equipped with the foregoing rotating mechanism, a considerable amount of particles are generated even if countermeasures against particle generation, e.g., periodical intra-chamber cleaning, are taken.

DISCLOSURE OF THE INVENTION

Accordingly, the object of the present invention to diminish particles in a substrate processing apparatus equipped with a rotating mechanism.

In order to achieve the above objective, according to a first aspect of the present invention, there is provided a substrate processing apparatus including: a process vessel defining a processing space for processing a substrate to be processed; a substrate support member that supports the substrate within the process vessel; a driven rotary member connected to the substrate support member directly or indirectly; and a driving rotary member that rotates in contact with the driven rotary member to cause the driven rotary member to rotate, thereby to cause the substrate support member to rotate, wherein the driven rotary member and the driving rotary member are formed of ceramic materials, respectively, whose values of fracture toughness defined by JIS R1607 are different from each other, and/or whose values of three-point bending strength defined by JIS R1601 are different from each other.

Preferably, the ceramic material of the driving rotary member is higher in the value of fracture toughness defined by JIS R1607 than the ceramic material of the driven rotary member. In this case, the fracture toughness of the ceramic material of the driving rotary member may be in the range of 4.5 to 5.5 [MPa$\sqrt{}$m] and that of the ceramic material of the driven rotary member may be in the range of 2.0 to 3.0 [MPa$\sqrt{}$m].

Preferably, the ceramic material of the driving rotary member is higher in the value of three-point bending strength defined by JIS R1601 than the ceramic material of the driven rotary member. In this case, the three-point bending strength of the ceramic material of the driving rotary member may be in the range of 510 to 570 [MPa] and that of the ceramic material of the driven rotary member may be in the range of 420 to 480 [MPa].

Preferably, the ceramic material of the driving rotary member is higher in both the value of fracture toughness defined by JIS R1607 and the value of three-point strength defined by JIS R1601 than the ceramic material of the driven rotary member.

Preferably, the contact surface of the driving rotary member in contact with the driven rotary member is inclined with respect to a rotational axis of the driving rotary member, and the contact surface of the driven rotary member in contact with the driving rotary member is inclined with respect to a rotational axis of the driven rotary member.

According to a second aspect of the present invention, there is provided a substrate processing apparatus including: a process vessel defining a processing space for processing a substrate; a substrate support member that supports the substrate within the process vessel; a driven rotary member formed of a ceramic material and connected to the substrate support member directly or indirectly; and a driving rotary member contacting with the driven rotary member through a cushioning member to drive the driven rotary member for rotation, the driving rotary member being formed of a ceramic material.

Preferably, the cushioning member is formed by an elastomer. An O-ring formed by an elastomer may be attached to a circumferential surface of the driving rotary member. Alternatively, a coating layer formed by an elastomer may be provided on a circumferential surface of the driving rotary member.

The foregoing substrate processing apparatus in the first and second aspects may be a heat treatment apparatus further provided with heating means for heating the substrate placed on the substrate support member.

According to a third aspect of the present invention, there is provided a substrate rotating device including: a driven rotary member configured so as to be capable of being connected directly or indirectly to a substrate support member for supporting a substrate; and a driving rotary member that rotates in contact with the driven rotary member, thereby causing the driven rotary member to rotate, wherein the driven rotary member and the driving rotary member are formed of ceramic materials, respectively, whose values of fracture toughness defined by JIS R1607 are different from each other, and/or whose values of three-point bending strength defined by JIS R1601 are different from each other.

According to a fourth aspect of the present invention, there is provided a substrate rotating device including: a driven rotary member formed of a ceramic material and configured so as to be capable of being connected directly or indirectly to a substrate support member for supporting a substrate; and a driving rotary member contacting with the driven rotary member through a cushioning member to drive the driven rotary member for rotation, the driving rotary member being formed of a ceramic material.

DESCRIPTION OF REFERENCE SIGNS

| 1:  | Process chamber (Process vessel) |
| --- | --- |
| 1a: | Upper chamber |
| 1b: | Lower chamber |
| 2:  | Quartz window |
| 3:  | Heating section |
| 4:  | Water-cooled jacket |
| 5:  | Tungsten lamp |
| 6:  | Bottom plate |
| 7:  | Rotor holder |
| 10: | Driving rotor (Driving rotary member) |
| 11: | Driven ring (Driven rotary member) |
| 12: | Wafer supporting plate (Substrate support member) |
| 13: | Support arm (Substrate support member) |
| 14: | Wafer supporting pin (Substrate support member) |

BEST MODE FOR CARRYING OUT THE INVENTION

Figure 1:
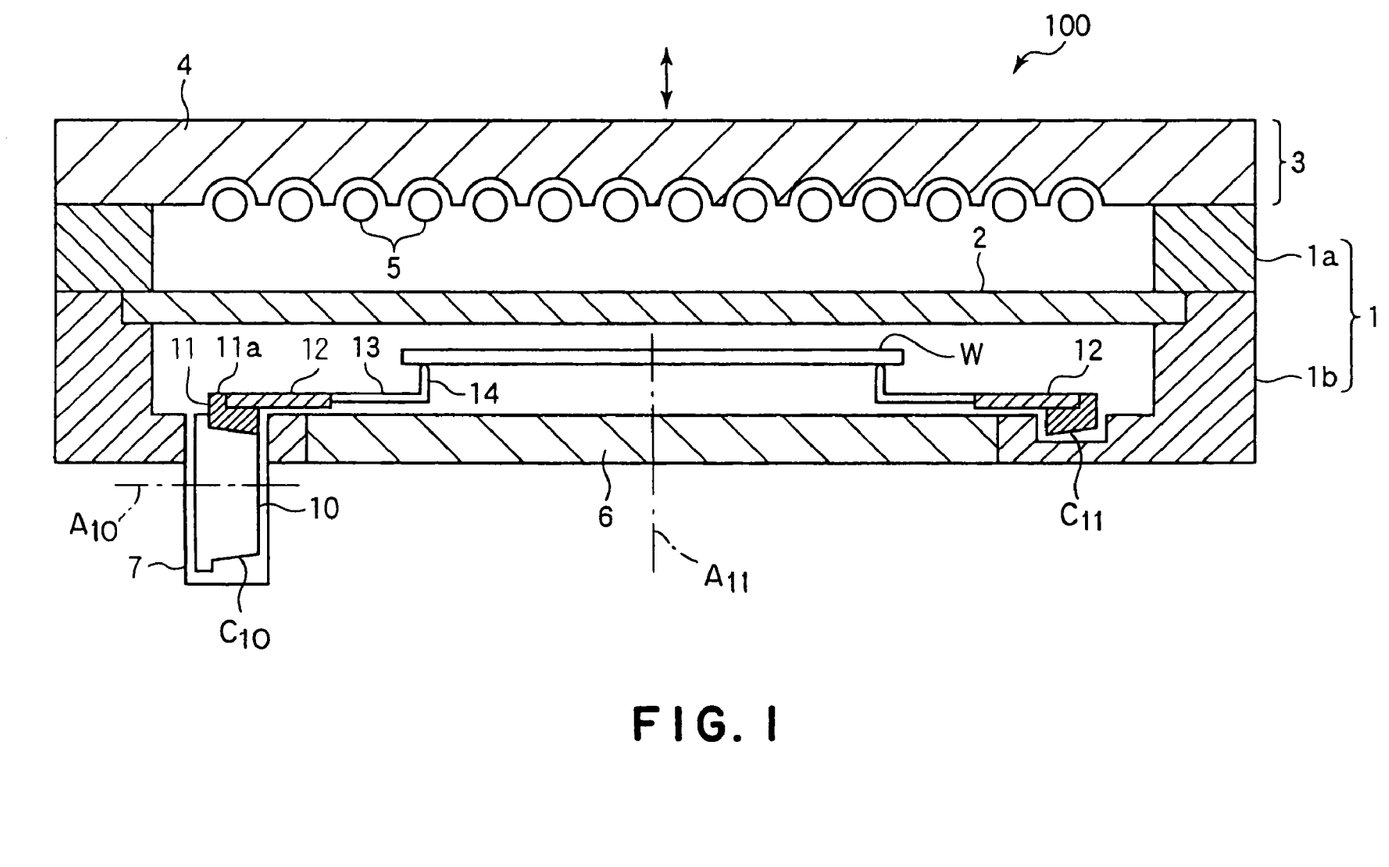
FIG. 1 is a sectional view showing schematically the configuration of a heat treatment apparatus according to an embodiment of the present invention.

Preferred embodiments of the present invention will be described below with reference to the drawings. FIG. 1 schematically illustrates the configuration of a heat treatment apparatus, i.e., a substrate processing apparatus, in one embodiment of the present invention. The heat treatment apparatus 100 is constituted as an RTP (Rapid Thermal Processor) suitable for performing RTA (Rapid Thermal Annealing) which is superior in controllability. The heat treatment apparatus 100 may be employed, for example, in a high-temperature annealing process which is carried out at a temperature of 600 to 1200° C. after a thin film formed on the surface of a semiconductor wafer W (hereinafter referred to simply as "wafer W") is doped with impurity.

In FIG. 1, the reference numeral 1 denotes a cylindrical process chamber. The process chamber 1 is made up of an upper chamber 1a and a lower chamber 1b which are separable from each other. A quartz window 2 is disposed between the upper and lower chambers 1a and 1b. A heating section 3 is detachably mounted to the upper portion of the chamber 1. The heating section 3 includes a water-cooled jacket 4 and plural tungsten lamps 5 as heating means disposed on the lower surface of the water-cooled jacket 4. A disc-shaped bottom plate 6 is detachably mounted to the underside of the process chamber 1. Three rotors 10 (10a, 10b, 10c), i.e., driving rotary members, are disposed around the bottom plate 6.

Sealing members (not shown) are interposed respectively between the water-cooled jacket 4 of the heating section 3 and the upper chamber 1a, between the upper chamber 1a and the quartz window 2, between the quartz window 2 and the lower chamber 1b, and between the lower chamber 1b and the bottom plate 6, whereby the process chamber 1 is kept airtight. The interior of the chamber 1 can be evacuated by an evacuator (not shown).

Figure 2:
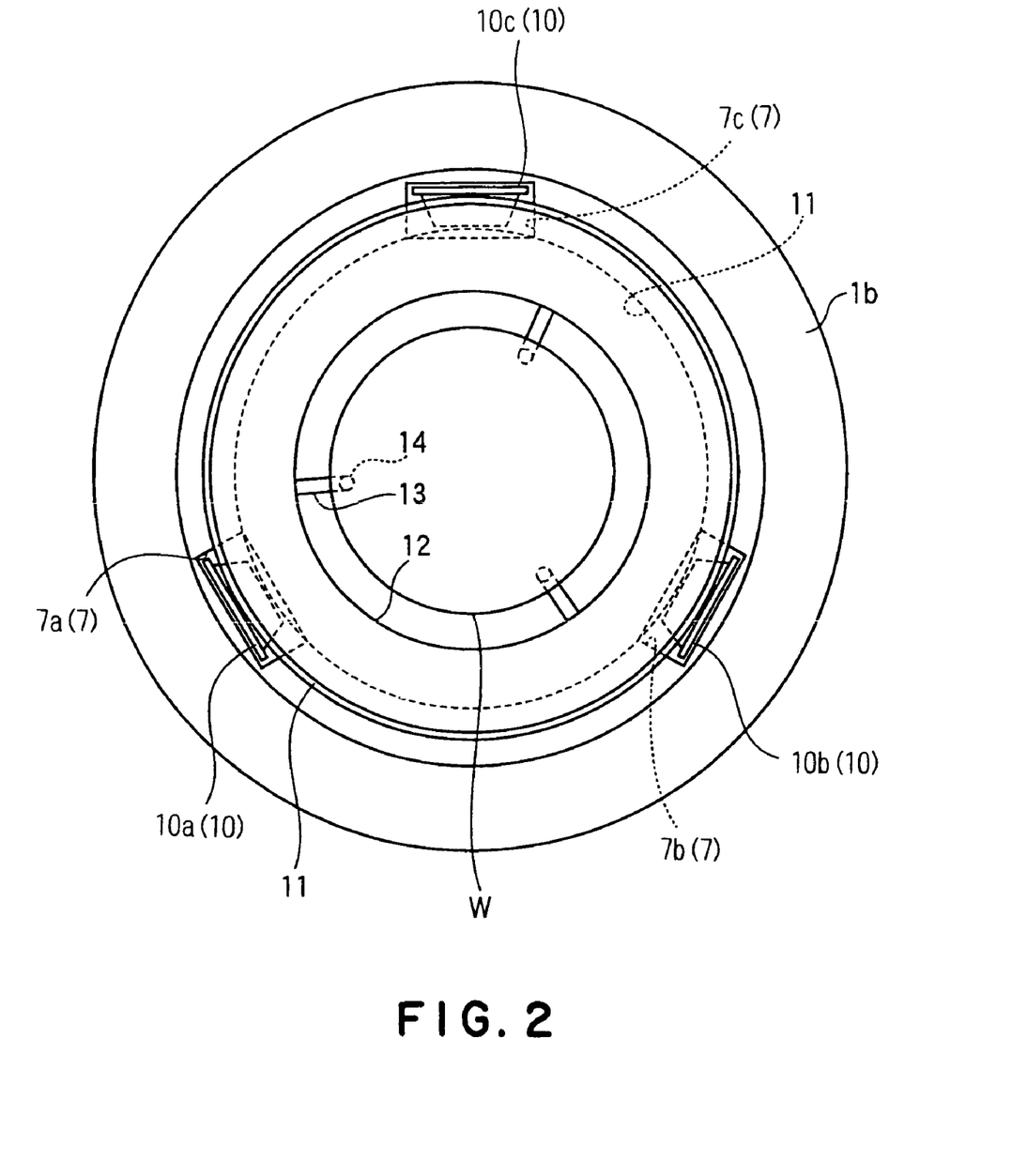
FIG. 2 is a plan view showing a lower structure of the heat treatment apparatus.

FIG. 2 is a plan view showing a lower portion of the heat treatment apparatus 100 with the upper chamber 1a, quartz window 2 and heating section 3 being removed. Formed in the bottom of the lower chamber 1b are plural, three in the illustrated embodiment, rotor holders 7 (7a, 7b, 7c), which open at equally divided positions on a circumference on the upper surface of the bottom of the lower chamber 1b. The driving rotors 10a, 10b and 10c formed of a ceramic material, i.e., driving rotary members, are accommodated within the rotor holders 7a, 7b and 7c, respectively, with their upper portions are exposed from the rotor holders 7a, 7b and 7c. The rotor holders 7a, 7b and 7c are sealed with sealing means (not shown) so that the interior of the process chamber is kept airtight.

Circumferential surfaces $C_{10}$ of the rotors 10a, 10b and 10c are each in the shape of a conical surface of a truncated cone and are therefore inclined with respect to the rotational axis $A_{10}$. That is, the rotors 10a, 10b and 10c are each formed so as to become smaller in diameter toward the center of the process chamber 1. A drive mechanism such as a motor (not shown) drives the rotors 10a, 10b and 10c for rotation.

A driven ring 11, i.e., a driven rotary member, is placed on the rotors 10a, 10b and 10c exposed from the rotor holder 7. The ring 11 is a circular ring formed of a ceramic material. The diameter of the outer periphery of the driven ring is approximately equal to the diameter of a circle passing through the three rotors 10a, 10b and 10c. In the cross-sectional view (FIG. 1), the bottom surface $C_{11}$ of the ring 11 is inclined with respect to the rotational axis $A_{11}$ of the ring 11 so as to continuously abut against circumferential surfaces $C_{10}$ of the rotors 10a, 10b, and 10c.

An upwardly projecting circumferential rim 11a is formed on top of the driven ring 11. An annular wafer supporting plate 12 having a central opening of a large-diameter is connected to the ring 11 with supporting plate 12 being fitted in the rim 11a. Plural (three in the illustrated embodiment) support arms 13 extending toward the center of the central opening of the wafer supporting plate 12 are provided on the inner circumferential surface of the wafer supporting plate 12, i.e., a wafer support member. Each support arm 13 is provided at the tip thereof with a wafer supporting pin 14 for abutment with the back side of a wafer W to support the wafer. For example, by providing lift pins (not shown) capable of protruding from and retracting into the bottom plate 6, it is possible to move the wafer W up and down.

After placing the wafer W on the wafer supporting pins 14, an airtight space is formed within the process chamber 1 and the interior thereof is evacuated to be in a vacuum state by means of an evacuator. Then, an electric current is supplied to each of the tungsten lamps 5. As a result, heat rays generated in the tungsten lamps 5 of the heating section 3 pass through the quartz window 2 and reach the wafer W, whereby the wafer W is heated rapidly.

During the heat treatment, the driving rotors 10a, 10b and 10c are rotated at a predetermined rotational speed. With the resulting friction exerted between the rotors 10a, 10b, 10c and the driven ring 11, that is, friction exerted between the contact surfaces $C_{10}$ and $C_{11}$, the rotational drive force of the rotors 10a, 10b and 10c is transmitted to the ring 11, so that the ring 11 also rotates. That is, when the rotors 10a, 10b and 10c rotate, the ring 11 rotates about the rotational axis $A_{11}$ which intersects perpendicularly to the rotational axes $A_{10}$ of the rotors 10a, 10b and 10c. This rotation is transmitted to the wafer W through the wafer supporting plate 12 connected to the ring 11 and further through the support arms 13. Consequently, the wafer W supported horizontally within the process chamber 1 rotates about a vertical rotational axis. As a result, in-plane uniformity of the amount of heat supplied to the wafer W is ensured.

Since the driving rotors 10a, 10 and 10c are formed in the shape of a truncated cone whose diameter becomes smaller toward the center of the process chamber 1, they act to maintain the rotational center (rotational axis $A_{11}$) of the driven ring 11 placed on the rotors always at the same position. Thus, the wafer W can be heated as desired and therefore it is possible, for example, to accurately control the distribution of impurities which is to be dispersed within a thin film by annealing.

After the end of the heating, the supply of the electric current to the tungsten lamps 5 in the heating section 3 is stopped, and the interior of the lower process chamber 1b is evacuated by an evacuator while injecting purge gas into the chamber 1b through a purge port (not shown) whereby the wafer W is cooled.

The driven ring 11 and the driving rotors 10 are respectively formed of ceramic materials whose values of fracture toughness defined by JIS R1607 are different from each other, and whose values of three-point bending strength defined by JIS R1601 are different from each other. By using ceramic materials, as a material of the ring 11 and a material of the rotor 10, one of which is high and the other low either in the value of fracture toughness and the value of three-point bending strength or in both the values of fracture toughness and of three-point bending strength, it is possible to greatly reduce the generation of particles.

Silicon carbide (SiC) and silicon nitride ($Si_3N_4$) may be illustrated as ceramic materials which may constitute the driven ring 11 and the driving rotors 10. These ceramic materials inherently have excellent wear resistance. However, when these ceramic materials are used for the wafer rotating mechanism installed within the process chamber 1 such as the rotors 10 and the ring 11, they are rubbed against each other under a load. Therefore, if both parts are formed of materials which are the same in the physical property values of fracture toughness and three-point bending strength, it is presumed that fine particles will occur. On the other hand, if they have different values of fracture toughness and three-point bending strength, it is possible to reduce the generation of particles.

In a preferred embodiment, for the ceramic material which constitutes the driving rotors 10, a ceramic material may be used, which is higher in the value of fracture toughness and/or the value of three-point bending strength than the ceramic material which constitutes the driven ring 11. In this case, for example, it is preferable that SiC having a fracture toughness of about 4.5 to 5.5 [MPa√m] be used as the material of the rotors 10 and SiC having a fracture toughness of about 2.0 to 3.0 [MPa√m] be used as the material of the ring 11. Further, for example, it is preferable that SiC having a three-point bending strength of about 510 to 570 [MPa] be used as the material of the rotors 10 and SiC having a three-point bending strength of 420 to 480 [MPa] be used as the material of the ring 11.

Next, the result of an experiment for proving the effect of the present invention will be described. In this test, the following two types of ceramics were used as the materials of the driving rotors 10. The following ceramic material A was used for the material of the driven ring 11.

Material A:

SiC (e.g., Product No. SC1000, a product of KYOCERA Corporation) having a fracture toughness of 2.5 [MPa√m] (JIS R1607, measured by using an SEPB (Single-Edge Pre-Cracked Beam) test piece, also in the following) and having a three-point bending strength (JIS R1601) of 450 [MPa]

Material B:

SiC (e.g., Product No. SC-211, a product of KYOCERA Corporation) having a fracture toughness of 4.9 [MPa√m] (JIS R1607) and having a three-point bending strength (JIS R1601) of 540 [MPa]

The experiment was conducted in the following manner. In the heat treatment apparatus 100 shown in FIG. 1, the driving rotors 10 were rotated at a rotational speed of 20 rpm and thereafter the number of particles having a size larger than 0.3 μm was counted on each of the three rotors 10a, 10b and 10c (see FIG. 2) by means of a suction type particle counter. The results are shown in Table 1. "Number of Wafers Processed" in Table 1 is determined by converting the number of revolutions of the rotors 10 in the experiment into the number of wafers W processed on the basis of the number of revolutions of the rotors 10 in every process of a single wafer in the ordinary heat treatment. In Table 1, data on the Comparative Example is an average value in three tests; and data on the Example is an average value in six tests.

TABLE 1

|  |  | Example | Comparative Example |
|---|---|---|---|
| Material of Rotors |  | Material B | Material A |
| Material of Ring |  | Material A | Material A |
| Number of Wafers processed |  | corresponding to 95539 pcs. | corresponding to 3117 pcs. |
| Number of | Roller10a | 305 | 12109 |
| >0.3 μm | Roller10b | 301 | 14515 |
| Particles | Roller10c | 249 | 11628 |

As shown in Table 1, in the case where the material A was used for both rotors and ring, as many as ten and several thousand particles were generated in a period corresponding to processing of about three thousand wafers W; while with the combination of materials A and B, only about three hundred particles at most even were generated in a period corresponding to processing of about one hundred thousand wafers W. A remarkable improvement was shown.

The inventors consider the reason for the result, that the combination of the materials A and B afforded better results than the use of the material A alone, as follows.

Even if the surfaces of the parts (rotors and ring) are machined smooth in appearance, it is impossible to eliminate microscopic concaves and convexes on those surfaces. In the case where the parts are formed of such a rigid fragile material as a ceramic material, if convex portions on the surfaces of the two members contact each other, a large stress concentration occurs on the convex portions since almost no convex portions are deformed. In this case, if the stress exceeds the breaking strength, the convex portions break. The broken convex portions become particles.

On the other hand, if one of the two parts is formed by using a material high in elastic deformability, the even upon mutual contact of convex portions on the surfaces of the two parts, the convex portion of one part undergoes elastic deformation with resultant increase of a substantial contact area, whereby it is possible to diminish stress concentration. In the case of a ceramic material as a fragile material, the values of fracture toughness and three-point bending strength are, in effect, indices of elastic deformability of the material, and larger values thereof means a higher elastic deformability of the material.

According to the above theory, it may be considered better to form both parts by using a ceramic material high in elastic deformability. In this case, however, the two parts will wear to the same degree and therefore it is presumed that the total amount of wear (i.e., the amount of particles generated) of the two parts will rather become large.

A concrete review will now be made about the materials A and B used in the experiment. As noted above, the materials A and B are SiC materials. Actually, a small amount of a binder (sintering aid) comprising a metal oxide is contained in each of the materials A and B. The binder content is higher in the material B than in the material A. Due to the difference in the binder content, a difference is recognized between the materials A and B in point of fracture toughness and three-point bending strength. Elastic deformability of the material B is higher because of its higher binder content. Therefore, in case of using the material B in combination with the material A having lower elastic deformability, it is presumed that the material B acts like a cushion on the basis of the above principle and suppresses breakage of convex portions on the part surfaces. In this case, the use of the material B for both rotors and ring is not preferable because, as noted above, not only the total amount of wear of the rotors and ring increases but also the amount of harmful particles derived from the metal oxide binder increases.

Figure 3:
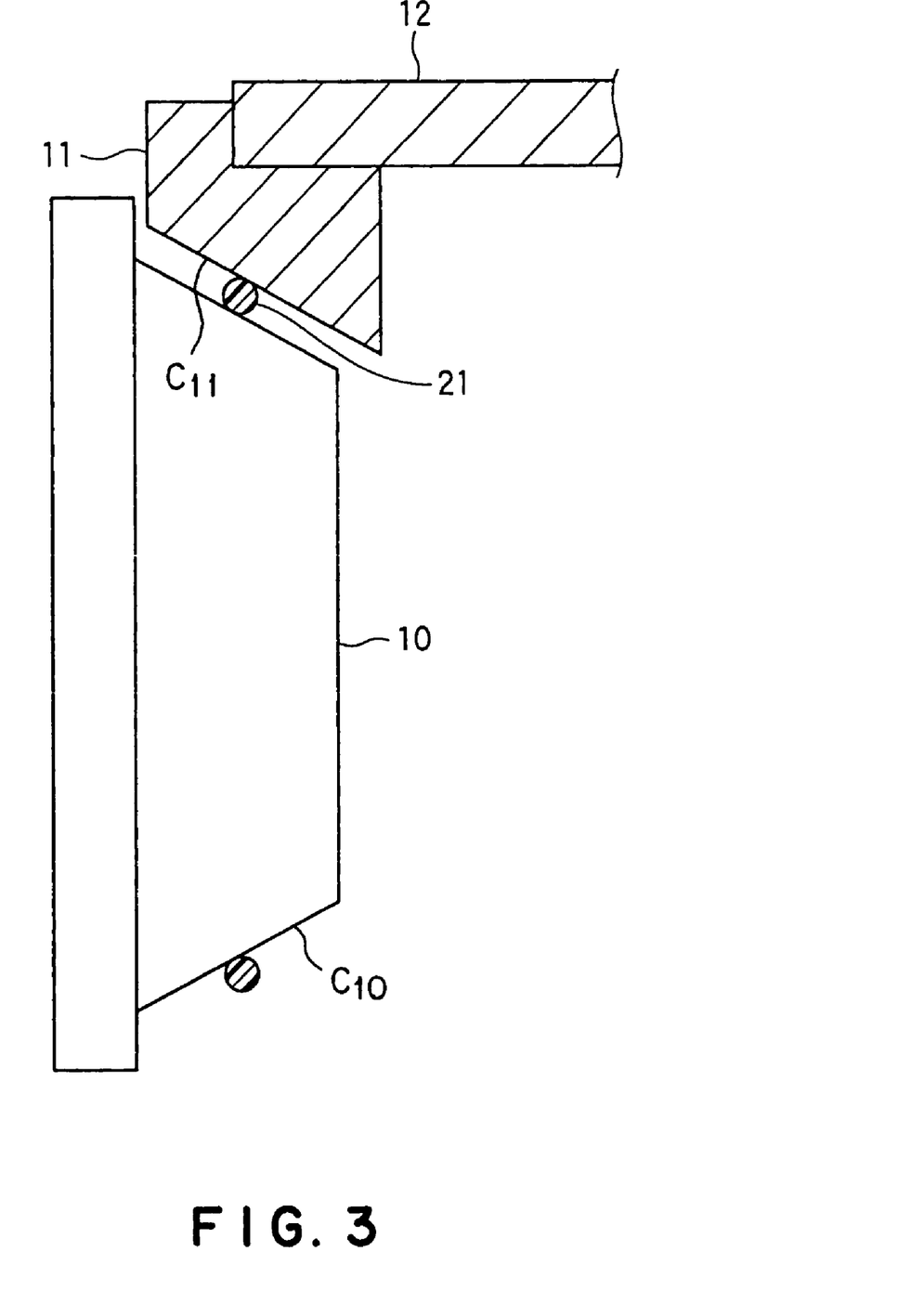
FIG. 3 is a sectional view showing schematically a principal portion of a heat treatment apparatus according to another embodiment of the present invention.

Next, with reference to FIGS. 3 and 4, a description will be given about heat treatment apparatus in another embodiment of the present invention. FIG. 3 is a sectional view of a driving rotor 10 and component parts disposed in the vicinity thereof which relate to the main portion of this embodiment. The section of the rotor 10 is not shown. In the heat treatment apparatus in this embodiment, the construction of its portion not shown in FIG. 3 is the same as that shown in FIG. 1. In this embodiment, an O-ring 21 is attached to a circumferential surface $C_{10}$ of the rotor 10 opposed to a bottom surface $C_{11}$ of a driven ring 11. With the O-ring 21, a direct contact between the rotor 10 and the ring 11 is avoided, so that particles resulting from mutual rubbing of the rotor 10 and the ring 11 are not generated. The amount of particles produced in the contact portion between the O-ring 21 and the rotor 10 and the contact portion between the O-ring 21 and the ring 11 is very small.

It is preferable to use a soft elastomer material having a heat resistance of at least up to about 300° C., as the material of the O-ring 21. Examples of such elastomer materials include perfluoroelastomers. More concrete examples are Barrel Perfluoro MP-300B, MSP-2 (trade name, Morisei Kako Co.), Kalrez (registered trademark) 4079 (DuPont Dow Elastomer Co.), and Armor series (NIPPON VALQUA INDUSTRIES, LTD.) such as Armor Crystal (registered trademark).

Figure 4:
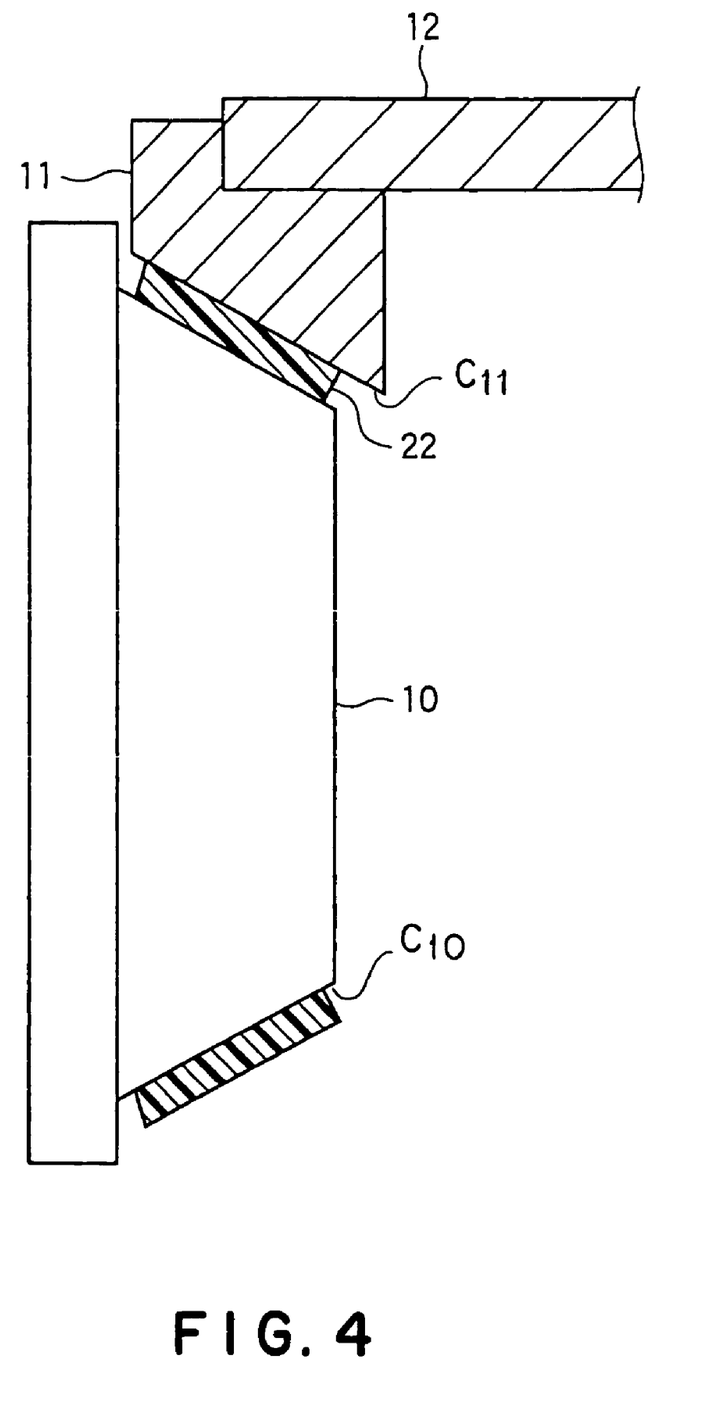
FIG. 4 is a sectional view showing schematically a principal portion of a heat treatment apparatus according to a further embodiment of the present invention.

FIG. 4 is a cross-sectional view of a driving rotor 10 and the vicinity thereof in a heat treatment apparatus in a still another embodiment of the present invention. In the heat treatment apparatus of this embodiment, the construction of its portion not shown in FIG. 4 is the same as that shown in FIG. 1. A section of the rotor 10 is not shown. In this embodiment, a coating layer 22 formed of an elastomer is provided on a circumferential surface $C_{10}$ of the rotor 10. With the coating layer 22, it is possible to avoid direct sliding contact between the rotor 10 and a driven ring 11 and hence possible to prevent generation of particles. The foregoing perfluoroelastomer may be used as the material of the coating layer 22.

The present invention is not limited to the above embodiments, and various modifications are possible. For example, the heat treatment apparatus 100 is not limited to an RTP, and, for example, it may be a thermal CVD apparatus insofar as the device has a rotating mechanism for rotating a substrate such as a wafer W within a chamber.

The invention claimed is:

1. A substrate processing apparatus comprising:
 a process vessel defining a processing space for processing a substrate;
 a substrate support member that supports the substrate within the process vessel;
 a driven rotary member connected to the substrate support member and
 a driving rotary member that rolls the driven rotary member to cause the driven rotary member to rotate, thereby to cause the substrate support member to rotate, wherein
 a contact surface of the driven rotary member that contacts with the driving rotary member is a toothless surface of revolution, and a contact surface of the driving rotary member that contacts with the contact surface of the driven rotary member also is a toothless surface of revolution,
 the driven rotary member and the substrate support member are supported by the driving rotary member; and
 the driven rotary member and the driving rotary member are formed of ceramic materials with binder contents that are different from each other to provide different values of fracture toughness as defined by JIS R1607, and/or different three-point bending strengths as defined by JIS R1601.

2. The substrate processing apparatus according to claim 1, wherein the ceramic material of the driving rotary member is higher in the value of fracture toughness defined by JIS R1607 than the ceramic material of the driven rotary member.

3. The substrate processing apparatus according to claim 1, wherein the ceramic material of the driving rotary member is higher in the value of three-point bending strength defined by JIS R1601 than the ceramic material of the driven rotary member.

4. The substrate processing apparatus according to claim 1, wherein the ceramic material of the driving rotary member is higher in both the value of fracture toughness defined by JIS R1607 and the value of three-point bending strength defined by JIS R1601 than the ceramic material of the driven rotary member.

5. The substrate processing apparatus according to claim 2, wherein the fracture toughness of the ceramic material of the driving rotary member is in a range of 4.5 to 5.5 [MPa√m] and that of the ceramic material of the driven rotary member is in a range of 2.0 to 3.0 [MPa√m].

6. The substrate processing apparatus according to claim 3, wherein the three-point bending strength of the ceramic material of the driving rotary member is in a range of 510 to 570 [MPa] and that of the ceramic material of the driven rotary member is in a range of 420 to 480 [MPa].

7. The substrate processing apparatus according to claim 1, wherein a contact surface of the driving rotary member being in contact with the driven rotary member is inclined with respect to a rotational axis of the driving rotary member, and a contact surface of the driven rotary member being in contact with the driving rotary member is inclined with respect to a rotational axis of the driven rotary member.

8. The substrate processing apparatus according to claim 1, said substrate processing apparatus is a heat treatment apparatus which further includes means for heating the substrate placed on the substrate support member.

9. The substrate processing apparatus according to claim 1, wherein a main component of the ceramic material forming the driven rotary member is the same component that forms the driving rotary member, and the binder content of the ceramic material forming the driven rotary member is a different binder content that forms the driving rotary member.

10. The substrate processing apparatus according to claim 9, wherein each of the ceramic materials forming the driven and drive rotary members include SiC as the main component and a metal oxide as the binder.

11. A substrate processing apparatus according to claim 1, wherein
the ceramic material of the driven rotary member contains a main component and a binder,
the ceramic material of the driving rotary member contains a main component and a binder,
the main component of the driven rotary member is the same component that forms the driving rotary member, and
one of the driven rotary member and the driving rotary member has a first binder content and the other of the driven rotary member and the driving member has a second binder content smaller than the first binder content.

12. A substrate processing apparatus according to claim 1, wherein the weight of both the driven rotary member and the substrate support member is supported on the driving rotary member.

* * * * *